United States Patent [19]
Leinkram et al.

[11] 3,833,425
[45] Sept. 3, 1974

[54] SOLAR CELL ARRAY

[75] Inventors: Charles Z. Leinkram, Bowie, Md.; William D. Oaks, Midland, Va.; John A. Eisele, Oxon Hill, Md.; Bruce J. Faraday, Annandale, Va.

[73] Assignee: The United States of America as represented by the Secretary of the Navy, Washington, D.C.

[22] Filed: Feb. 23, 1972

[21] Appl. No.: 228,593

[52] U.S. Cl. .................................... 136/89, 29/572
[51] Int. Cl. .................................... H01l 15/02
[58] Field of Search .......... 136/89; 29/195 S, 195 Y

[56] References Cited

UNITED STATES PATENTS

| | | | |
|---|---|---|---|
| 2,971,251 | 2/1961 | Willemse | 20/195 S |
| 3,121,648 | 2/1964 | Jensen | 136/89 |
| 3,159,462 | 12/1964 | Kaldeberg | 29/195 S |
| 3,346,419 | 10/1967 | Webb | 136/89 |
| 3,370,986 | 2/1968 | Armsterdam et al. | 136/89 |
| 3,391,446 | 7/1968 | Buttle | 29/195 S |
| 3,532,551 | 10/1970 | Webb | 136/89 |

OTHER PUBLICATIONS

The Condensed Chemical Dictionary, 8th ed., 1971, Van Nostrand Reinhold Co., page 109.

P. E. Beaudouin et al., "Improved Cedhesion of Multi-Layered Metallurgiesin Semiconductor" in IBM T.D.B. Vol. 13, No. 10., March 1971, page 3003.

*Primary Examiner*—A. B. Curtis
*Attorney, Agent, or Firm*—R. S. Sciascia; Arthur L. Branning; Phillip Schneider

[57] ABSTRACT

A solar cell planar array fabricated by a method from the solar cells to the mounting panel. An electrically insulative, thermally conductive wafer is soft-soldered to the surface of the metallic mounting panel. The top surface of the wafer bears spaced electrically insulative, thermally conductive prominences thereon. The solar cells are attached on top of the prominences.

7 Claims, 6 Drawing Figures

SOLAR CELL ARRAY

STATEMENT OF GOVERNMENT INTEREST

The invention described herein may be manufactured and used by or for the Government of the United States for governmental purposes without the payment of any royalties thereon or therefor.

BACKGROUND OF THE INVENTION

This invention relates to the mounting of solar cells and especially to an array of planar-mounted solar cells which provides a large increase in the thermal dissipation capacity of the solar cell assembly or array.

Prior to this invention, the silicon cells in a solar cell assembly for powering an earth-circling satellite were mounted on the aluminum panel according to the following sequence:

1. A five-mil layer of fiberglass was secured to the aluminum-chassis panel by means of epoxy;
2. The cell array was then secured to the fiberglass layer by either a silicone adhesive or an epoxy.

This approach suffered from the poor thermal conductivity of both the fiberglass and the epoxy mounting adhesive. In addition, because of the thermal coefficient of linear expansion between the aluminum, fiberglass, epoxy and silicon, high mechanical stresses occurred and potential failure modes existed.

The present invention provides an excellent thermal path between the panel and the cells, a low absorptivity-to-emissivity-ratio coating on the exposed non-electrical parts of the cells and panel, and eliminates the potential failure mode caused by the linear thermal expansion mismatch.

SUMMARY OF THE INVENTION

The objects and advantages of the present invention are accomplished by the use of a metallized wafer between the solar cells and the metal mounting chassis, which wafer is a good heat conductor and an electrical insulator, the use of metallic, electrically conductive solders between the solar cells and the wafer and between the wafer and the mounting panel, and the use of a metallized tape to cover the non-active parts of the cell array and the mounting panel, the tape being non-absorptive to incoming solar radiation but transmissive to infrared energy (heat) arising in the solar cell array.

OBJECTS OF THE INVENTION

An object of this invention is to provide a thermally conductive, electrically insulative path between the solar cells and the satellite chassis.

Another object is to protect the exposed passive areas (non-solar-cell areas) of the panel with a low absorptivity-to-emissivity-ratio coating to keep the panel as cool as possible.

A further object is to minimize potential failure modes caused by mismatch of thermal coefficients of linear expansion of the various components of the solar cell array and the panel.

DETAILED DESCRIPTION

Figure 1:
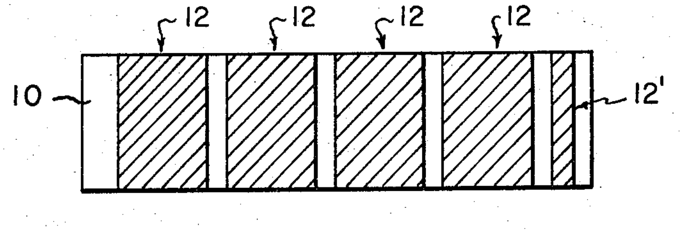
FIG. 1 is a schematic illustration of a top view of the beryllia wafer used with the invention.
Figure 2:
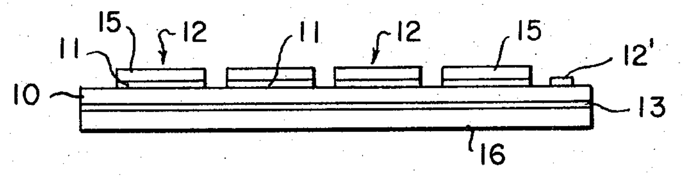
FIG. 2 is a schematic illustration of a side view of the beryllia wafer used with the invention.

The silicon solar cell array is assembled by taking a beryllia (beryllium oxide or BeO) ceramic wafer 10 (see FIGS. 1 and 2) and coating it on the top and bottom surfaces with a 500A layer of a metal such as chromium (11 & 13) which has good adherence to the beryllia and then with a 3000A layer of copper (15 & 16). This can be done by silk-screening the chromium and then electroplating the copper, or by vacuum deposition of a chromium copper and then electroplating additional copper up to the desired thickness (e.g. 0.5 to 1.0 mil). Copper may be used because of its excellent wetability by solder and a material is desired which solders easily and has good heat and good electrical conductivities.

The side to which the silicon solar cells are to be mounted is then etched down to the wafer surface by standard photoengraving techniques to form metallic prominences 12 and 12'. The etching provides mounting pads and the desired planar interconnection configuration (for example, the embodiment shown in the drawings is convenient for series interconnection of the cells). The surfaces of the prominences 12 are then tinned with a resin flux and tin-lead eutectic solder and the silicon cells 22 are mounted on and soldered to the copper prominences or mounting pads 12 using flux and a solder reflux.

Figure 3:
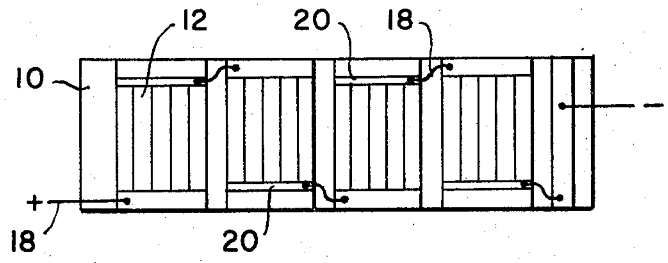
FIG. 3 is a schematic illustration of a top view of solar cells mounted on the beryllia wafer.
Figure 4:
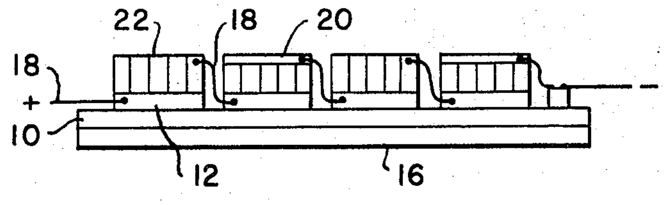
FIG. 4 is a schematic illustration of a side view of solar cells mounted on the beryllia wafer.
Figure 5:
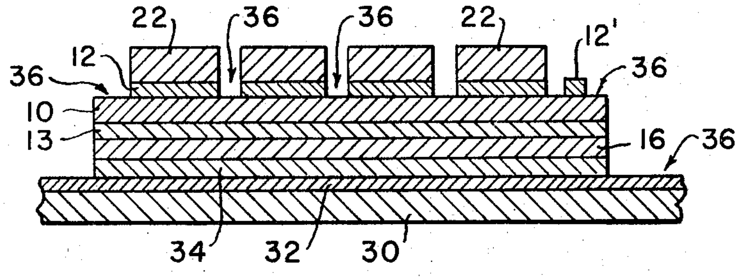
FIG. 5 is a schematic illustration of a side view of the solar cell array mounted on a panel.
Figure 6:
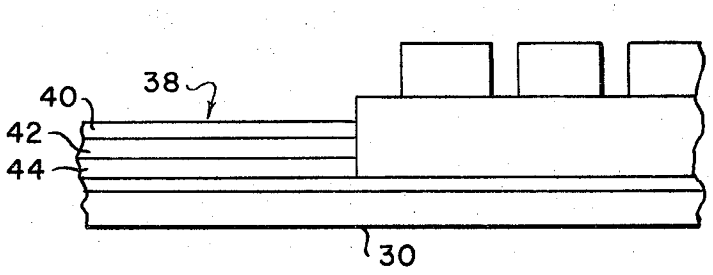
FIG. 6 is a schematic illustration of a side view of solar cells mounted on a panel which is covered by an infrared-radiating cover.

The connections from the n side of each silicon cell 22 to the p side of the next cell are made by soldering copper wire 18 as indicated in FIGS. 3 and 4. Each cell 22 is formed with a step 20 on one side, the step being tinned for soldering. The wire on the right-end cell is soldered to the top of the narrow prominence 12' to which the negative output lead is also attached.

A portion or panel of the aluminum chassis 30 of the satellite is plated with a copper layer 32. The copper plating is now tinned with a soft solder such as an indium solder (e.g., Alpha Metals Co.'s indium solder No. 2 or equivalent). Flux is applied and the bottom copper surface 16 of the solar cell assembly is soldered to the indium-tinned surface 34 of the aluminum panel.

The parts 36 of the aluminum panel and of the solar cell assembly which are exposed to the sun's radiation and are passive, that is, are not covered by a solar cell, are now covered by an infrared-radiating covering 38 consisting of a layer of fluorinated ethylene polypropylene (Teflon FEP) 40, a layer of silver 42 and a layer of inconel (a well-known nickel-iron alloy) metal 44. This covering has the properties of low absorptivity of the sun's visible radiation and high emissivity of infrared so that heat generated by the solar cells is radiated away quickly. The covering 38 forms a second-surface mirror and is attached by an adhesive such as the polyurethane adhesive, Solithane 113, made by the Thiokol Chemical Company. The Teflon FEP tape may be the 2-mil variety manufactured by the Schjeldahl Co. as their type g 4003. The infrared-radiating covering 38 prevents the clear passive areas from absorbing much of the sun's visible-spectrum energy and at the same time acts to radiate out the heat generated by the silicon cells.

The use of the soft indium solder prevents breakages due to the mismatch of thermal coefficients of linear expansion of the metals and the wafer. The solder absorbs the stresses.

The structure of the solar cell assembly described herein provides a good thermal path directly from the beryllia wafer to the aluminum panel where the heat can spread sidewards for reradiation into outer space. What is meant herein by a "good" thermal path, or "good" thermal conductivity, is a path or conductivity roughly similar in value to the conductivity of a metal. Thus, the thermal conductivity of copper is 0.90 calorie/sec/cm$^2$/°C/cm and that of beryllia is 0.60. That of aluminum is 0.44.

It will be apparent that although the invention has been described in connection with solar cell arrays for satellite use, the invention has applications which require an electrically insulated, thermally conductive solar cell system.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A solar cell array having a direct, good, thermal path from the solar cells to the metal panel on which they are mounted comprising:

a plurality of solar cells;

a wafer fabricated from an electrically insulative but thermally conductive material whose thermal conductivity is roughly similar to that of a metal, said wafer bearing spaced, good electrically and thermally conductive prominences on its top surface and a good electrically and thermally conductive coating on its bottom surface; and a metal mounting panel having a metallic coating on one surface and a coating of soft solder on said metallic coating;

said solar cells being attached on said prominences, the bottom surface of said wafer being soldered to the soft-solder surface of said panel.

2. A solar cell array as in claim 1, wherein:

said wafer is fabricated from beryllium oxide;

said prominences and said coating on the bottom surface of said wafer comprise an inner layer of chromium and an outer layer of copper; and said soft solder is an indium solder.

3. A solar cell array for attachment to a metal panel comprising, in combination:

a plurality of solar cells;

a wafer-like member of beryllia, said beryllia being coated on its bottom surface with a metallic coating, the beryllia bearing on its top surface a plurality of individual metallic prominences isolated from each other, each solar cell being soldered on a different one of said prominences by means of a thermally conductive solder; and a layer of soft, solder having good thermal conductivity disposed between the bottom coating of said beryllia and said metal panel, by which means said beryllia coating and said panel adhere to each other, said array having a good thermally conductive path between the solar cells and the panel, and the beryllia insulating said path to electrically isolate the cells from the panel.

4. An array as in claim 3, wherein said thermally conductive solder is indium solder.

5. An array as in claim 3, wherein said solar cells are silicon cells.

6. An array as in claim 3, wherein said coating material and said prominences are formed from a first layer of chromium and a second layer of copper.

7. An array as in claim 6, wherein said metal panel is coated on its solder-contacting surface with a layer of copper.

* * * * *